United States Patent
Chang et al.

(10) Patent No.: US 9,398,689 B2
(45) Date of Patent: Jul. 19, 2016

(54) SUBSTRATE STRUCTURE AND FABRICATION METHOD THEREOF

(71) Applicant: Siliconware Precision Industries Co., Ltd., Taichung (TW)

(72) Inventors: Cheng-An Chang, Taichung (TW);
Sung-Huan Sun, Taichung (TW);
Wen-Kai Liao, Taichung (TW);
Chien-Hung Wu, Taichung (TW);
Yi-Cheih Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/463,049

(22) Filed: Aug. 19, 2014

(65) Prior Publication Data
US 2015/0214168 A1     Jul. 30, 2015

(30) Foreign Application Priority Data
Jan. 24, 2014  (TW) ................................. 103102603

(51) Int. Cl.
*H05K 1/03* (2006.01)
*H01L 23/00* (2006.01)
*H01L 23/498* (2006.01)
*H05K 3/34* (2006.01)
*H01L 23/31* (2006.01)

(52) U.S. Cl.
CPC .......... *H05K 1/032* (2013.01); *H01L 23/49816* (2013.01); *H01L 23/562* (2013.01); *H01L 23/564* (2013.01); *H01L 24/05* (2013.01); *H01L 24/13* (2013.01); *H05K 3/3452* (2013.01); *H05K 3/3457* (2013.01); *H01L 23/3192* (2013.01); *H01L 24/02* (2013.01); *H01L 24/94* (2013.01); *H01L 2224/02165* (2013.01); *H01L 2224/02235* (2013.01); *H01L 2224/02331* (2013.01); *H01L 2224/0401* (2013.01); *H01L 2224/05571* (2013.01); *H01L 2224/10145* (2013.01); *H01L 2224/131* (2013.01); *H01L 2224/13021* (2013.01); *H01L 2224/13024* (2013.01); *H01L 2224/94* (2013.01); *H01L 2924/3512* (2013.01); *H01L 2924/384* (2013.01); *H05K 2201/09909* (2013.01); *H05K 2203/041* (2013.01)

(58) Field of Classification Search
CPC . H01L 24/06; H01L 24/03; H01L 2224/0401; H01L 2224/0601; H01L 2924/3512; H01L 2924/384; H05K 1/032; H05K 1/111; H05K 2201/0154; H05K 2201/0939
See application file for complete search history.

(56) References Cited

U.S. PATENT DOCUMENTS

| | | | | |
|---|---|---|---|---|
| 2005/0280149 A1* | 12/2005 | Tsutsui | .................... | H01L 24/03 257/734 |
| 2008/0142982 A1* | 6/2008 | Zhang | ............... | H01L 23/53238 257/762 |
| 2012/0061823 A1* | 3/2012 | Wu | ..................... | H01L 23/3157 257/737 |
| 2012/0273938 A1* | 11/2012 | Choi | ................. | H01L 23/49816 257/737 |

* cited by examiner

*Primary Examiner* — Michelle Mandala
(74) *Attorney, Agent, or Firm* — Mintz Levin Cohn Ferris Glovsky and Popeo, P.C.; Peter F. Corless; Steven M. Jensen

(57) ABSTRACT

A substrate structure is provided, which includes: a substrate body having a plurality of conductive pads; an insulating layer formed on the substrate body and having a plurality of openings for correspondingly exposing the conductive pads; and a plurality of ring bodies formed in the openings and corresponding in position to edges of the conductive pads. As such, a plurality of conductive elements can be subsequently formed inside the ring bodies so as to be prevented by the ring bodies from expanding outward during a reflow process, thereby protecting the insulating layer from being compressed by the conductive elements and preventing cracking of the insulating layer.

22 Claims, 5 Drawing Sheets ated semiconductor packaging technologies, are advanced semiconductor packaging technologies and characterized in that a semiconductor device and a plurality of solder balls are mounted on opposite surfaces of a packaging substrate. The solder balls are arranged in a grid array on the packaging substrate so as to achieve more I/O connections per unit area and hence meet the high integration requirement of semiconductor chips. Further, the overall package can be electrically connected to an external electronic device through the solder balls.

SUBSTRATE STRUCTURE AND FABRICATION METHOD THEREOF

CROSS-REFERENCES TO RELATED APPLICATIONS

This application claims under 35 U.S.C. §119(a) the benefit of Taiwanese Application No. 103102603, filed Jan. 24, 2014, the entire contents of which is incorporated herein by reference.

BACKGROUND OF THE INVENTION

1. Field of the Invention

The present invention relates to structure structures and fabrication methods thereof, and more particularly, to a substrate structure having an insulating layer and a fabrication method thereof.

2. Description of Related Art

Along with the progress of semiconductor packaging technologies, various package types have been developed for semiconductor devices. Particularly, BGA (Ball Grid Array) technologies, such as PBGA, EBGA and FCBGA technologies, are advanced semiconductor packaging technologies and characterized in that a semiconductor device and a plurality of solder balls are mounted on opposite surfaces of a packaging substrate. The solder balls are arranged in a grid array on the packaging substrate so as to achieve more I/O connections per unit area and hence meet the high integration requirement of semiconductor chips. Further, the overall package can be electrically connected to an external electronic device through the solder balls.

In addition, as semiconductor packages are developed toward miniaturization, multi-function, high speed and high frequency, circuit boards (or packaging substrates) used in the semiconductor packages are developed toward fine pitch.

FIG. 1 is a schematic cross-sectional view of a conventional packaging substrate 1. Referring to FIG. 1, a substrate body 10 having a plurality of conductive pads 100 and circuits 101 is provided. A solder mask layer 11 is formed on the substrate body 10 and a plurality of openings 110 are formed in the solder mask layer 11 for correspondingly exposing the conductive pads 100. The openings 110 have a projective width R less than the width A of the corresponding conductive pads 100. Thereafter, a plurality of solder balls 13 are formed on and electrically connected to the conductive pads 100. As such, a packaging substrate 1 used for a flip-chip package is achieved. By reflowing the solder balls 13, the packaging substrate can be electrically connected to an electronic element, such as a semiconductor chip (not shown).

By using the solder balls 13 as interconnection elements, the conventional packaging substrate 1 has shortened electrical transmission paths, reduced package size and improved electrical performance.

However, during the reflow process, the solder material of the solder balls 13 easily expands outward along the circuits 101 and flows to the bottom of the solder mask layer 11. Since the solder mask layer 11 and the solder balls 13 are made of different materials, a CTE (Coefficient of Thermal Expansion) difference therebetween easily causes cracking of the solder mask layer 11, for example, a crack K of FIG. 1. As such, chemicals used in the process easily come into contact with the substrate body 10 through the crack K and consequently contaminate the substrate body 10. Further, moisture may enter into the substrate body 10 through the crack K and cause an oxidization of the circuits 101 or a short circuit.

Further, in a reliability test (such as high temperature storage or drop), stress variation easily occurs to the crack K of the solder mask layer 11 and causes problems such as large-area cracking and poor quality of the solder mask layer 11.

In addition, referring to FIG. 1', the projective width R' of the openings 110' can be greater than the width A of the conductive pads 100 so as to completely expose the conductive pads 100, thereby preventing the solder material of the solder balls 13 from flowing along the circuits 101 to the bottom of the solder mask layer 11. However, if the projective width R' of the openings 110' is not large enough, the solder balls 13 may still compress the solder mask layer 11 and result in large-area cracking and poor quality of the solder mask layer 11. On the other hand, although the projective width R' of the openings 110' can be further increased to overcome the above-described problems, it will reduce the space on the substrate body 10 for wiring and easily cause delamination of the conductive pads 100.

Similarly, the above-described problems may occur between the solder balls 13 and the semiconductor chip.

Therefore, there is a need to provide a substrate structure and a fabrication method thereof so as to overcome the above-described drawbacks.

SUMMARY OF THE INVENTION

In view of the above-described drawbacks, the present invention provides a substrate structure, which comprises: a substrate body having a plurality of conductive pads; an insulating layer formed on the substrate body and having a plurality of openings for correspondingly exposing the conductive pads; and a plurality of ring bodies formed in the openings and corresponding in position to edges of the conductive pads.

The present invention further provides a method for fabricating a substrate structure, which comprises the steps of: providing a substrate body having a plurality of conductive pads; forming an insulating layer on the substrate body; and forming a plurality of openings in the insulating layer for correspondingly exposing the conductive pads and forming in the openings a plurality of ring bodies corresponding in position to edges of the conductive pads.

In the above-described method, the ring bodies and the openings can be formed at the same time. In an embodiment, the insulating layer is partially removed to form the openings and portions of the insulating layer inside the openings are retained to form the ring bodies.

In the above-described structure and method, the substrate body can further have a plurality of circuits formed thereon and electrically connected to the conductive pads, and the ring bodies can be over the circuits. In an embodiment, a plurality of junctions are formed between the conductive pads and the circuits and the ring bodies are over the junctions.

In the above-described structure and method, the insulating layer can be made of a solder mask material or a dielectric material.

In the above-described structure and method, the openings can have a projective width greater than the width of the conductive pads.

In the above-described structure and method, the ring bodies can be positioned outside the edges of the corresponding conductive pads.

In the above-described structure and method, the ring bodies and the insulating layer can be made of a same material. For example, the ring bodies can be made of polyimide (PI), benzocyclobutene (BCB) or polybenzoxazole (PBO).

In the above-described structure and method, a plurality of conductive elements can be formed inside the ring bodies and electrically connected to the conductive pads.

In the above-described structure and method, the substrate body can be a circuit board or a semiconductor base material.

In the above-described structure and method, if the substrate body is a semiconductor base material, the semiconductor body can further have an RDL (Redistribution Layer) structure electrically connected to the conductive pads.

In the above-described structure and method, each of the conductive pads can further be connected to a metal line that is formed on the substrate body, partially covered by the insulating layer and partially exposed from the corresponding opening, wherein the corresponding ring body passes through the metal line.

According to the present invention, by forming ring bodies in the openings of the insulating layer, the conductive elements can be formed inside the ring bodies so as to be prevented from expanding outward during a reflow process, thereby protecting the insulating layer from being compressed by the conductive elements and hence preventing cracking of the insulating layer.

Therefore, during subsequent processes, chemicals do not come into contact with the substrate body, thereby preventing the substrate body from being contaminated by the chemicals. Further, since moisture cannot enter into the substrate body, the present invention prevents a circuit oxidization or a short circuit from occurring.

Furthermore, during a reliability test (such as high temperature storage or drop), since there is no unexpected stress variation occurring to the insulating layer, the present invention overcomes the conventional problems such as large-area cracking and poor quality of the insulating layer.

Moreover, even if the openings have a small projective width, the conductive elements can be prevented by the ring bodies from expanding outward and compressing the insulating layer. Therefore, the present invention does not need to increase the projective width of the openings and hence allows more space to be used for wiring.

In addition, metal lines and circuits can be connected to the conductive pads and pressed and fixed by the insulating layer (or the ring bodies) so as to facilitate to fix the conductive pads on the substrate body and prevent delamination of the conductive pads.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "on", "a" etc. are merely for illustrative purposes and should not be construed to limit the scope of the present invention.

FIGS. 2A to 2D are schematic cross-sectional views showing a method for fabricating a substrate structure 2 according to the present invention.

Figure 1:
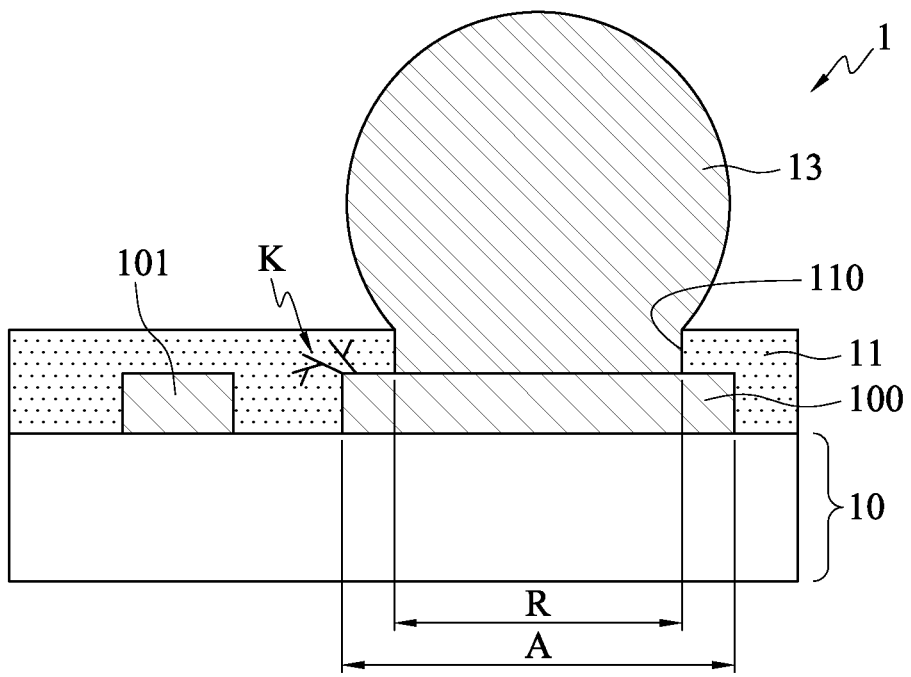
FIGS. 1 and 1' are schematic cross-sectional views showing structures of a conventional packaging substrate.
Figure 1:
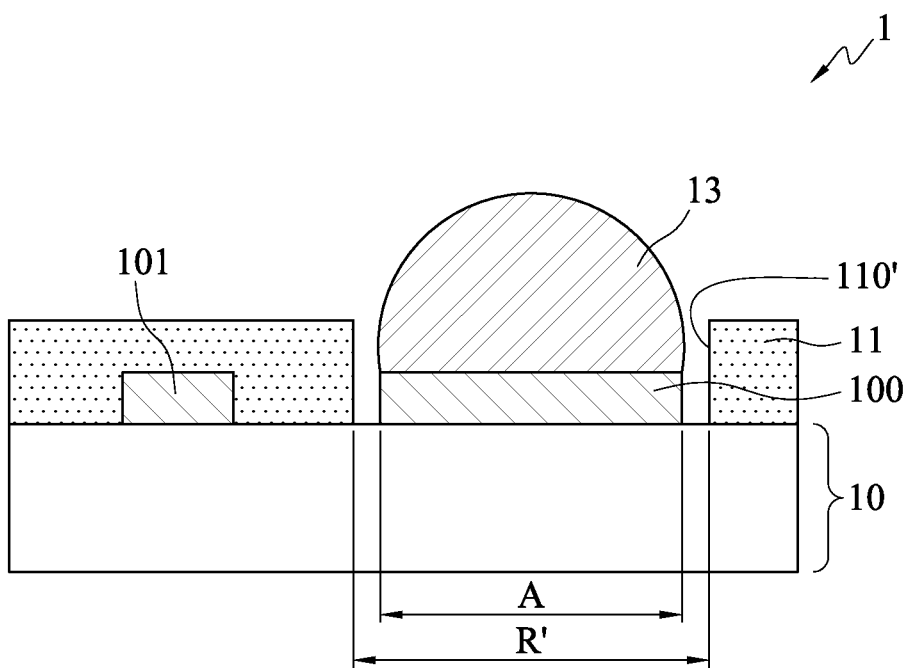
Figure 2A:
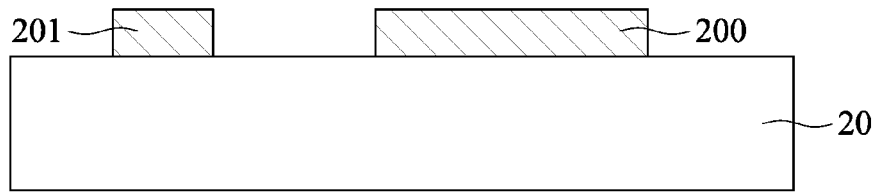
FIGS. 2A to 2D' are schematic cross-sectional views showing a method for fabricating a substrate structure according to the present invention, wherein FIG. 2D' shows another embodiment of FIG. 2D.

Referring to FIG. 2A, a substrate body 20 having a plurality of conductive pads 200 and a plurality of circuits 201 are provided.

In the present embodiment, the substrate body 20 is a circuit board, which has a plurality of dielectric layers (not shown) and a plurality of inner circuit layers (not shown). The conductive pads 200 and the circuits 201 are formed on the outermost dielectric layer and electrically connected to the inner circuit layers.

In other embodiments, the substrate body 20 can be a semiconductor base material, for example, a semiconductor wafer, a chip, an interposer having through silicon vias (TSVs) and so on. The substrate body 20 has a plurality of passivation layers 240 (as shown in FIG. 2D') and a plurality of inner integrated circuits (not shown) or redistribution layers 241 (as shown in FIG. 2D'). The conductive pads 200 and the circuits 201 are formed on the outermost passivation layer 240 and electrically connected to the inner integrated circuits. The conductive pads 200 and the circuits 201 can be formed as a redistribution layer.

Further, the circuits 201 are electrically connected to the conductive pads 200.

Figure 2B:
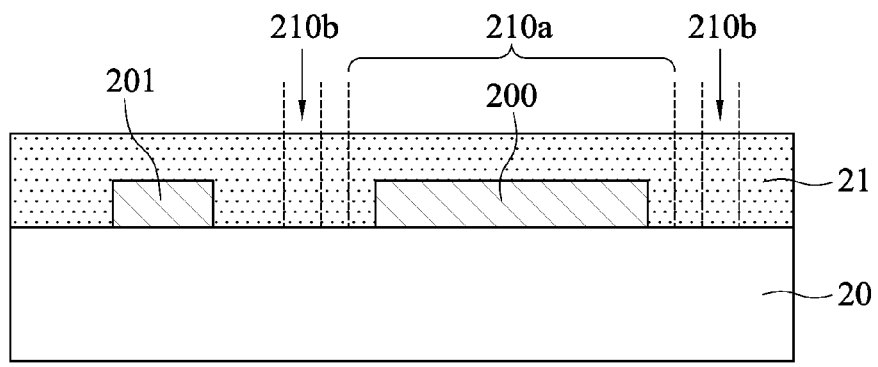

Referring to FIG. 2B, an insulating layer 21 is formed on the substrate body 20.

In the present embodiment, the insulating layer 21 is made of a solder mask material or a dielectric material, such as polyimide (PI), benzocyclobutene (BCB) or polybenzoxazole (PBO).

Figure 2C:
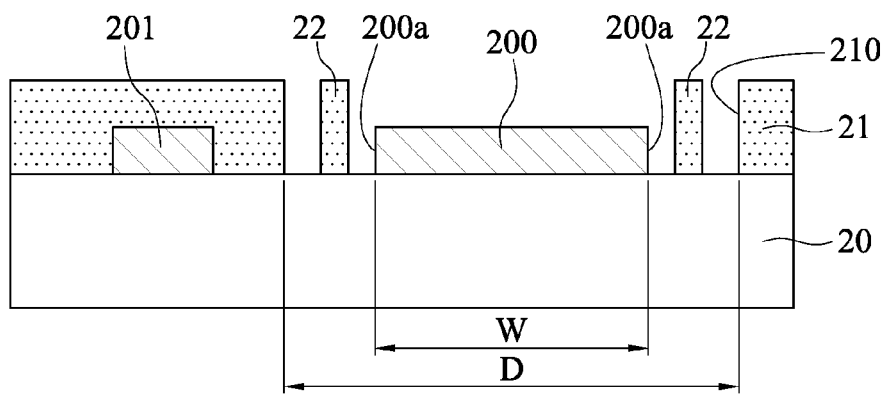
Figure 2D:
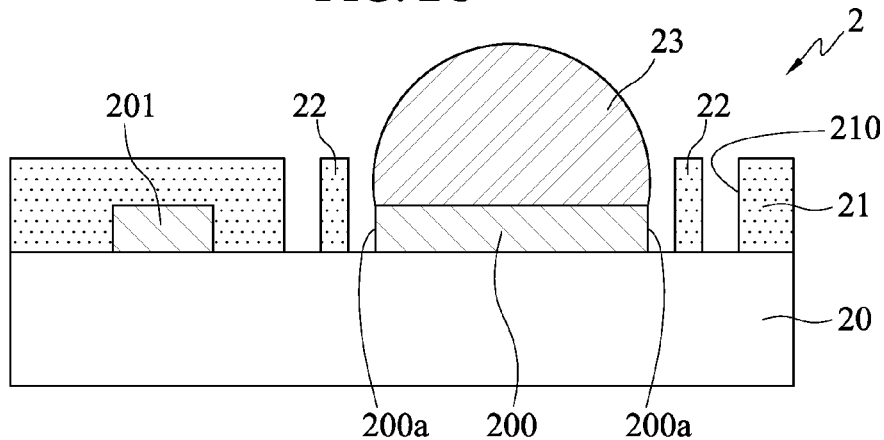
Figure 2D:
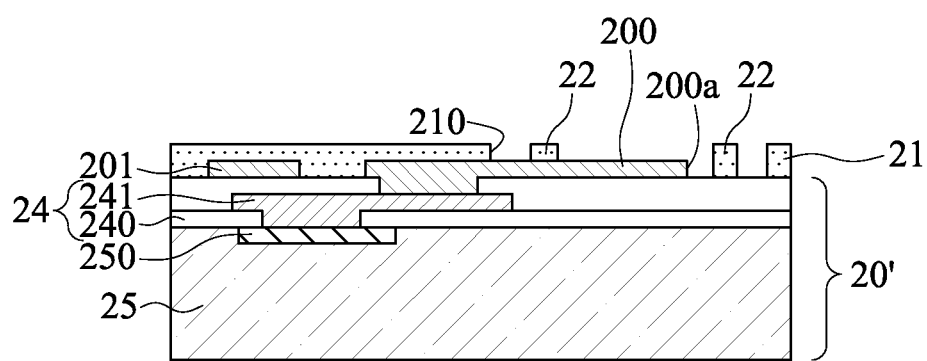

Referring to FIG. 2C, a plurality of openings 210 are formed in the insulating layer 21 for correspondingly exposing the conductive pads 200, and a plurality of ring bodies 22 are formed in the openings 210 and around edges 200a of the corresponding conductive pads 200.

In the present embodiment, the projective width D of the openings 210 is greater than the width W of the corresponding conductive pads 200 so as to completely expose the conductive pads 200, thereby preventing a solder material from flowing along the circuits 201 to the bottom of the insulating layer 21 in subsequent processes.

The ring bodies 22 are of a geometric shape. For example, the ring bodies 22 can be of a circular shape of FIG. 3A or the ring bodies 22' can be of an octagonal shape of FIG. 3B. The ring bodies 22 and the openings 210 are formed at the same time. In particular, when the openings 210 are formed by partially removing the insulating layer 21, portions of the insulating layer 21 inside the openings 210 are retained to form the ring bodies 22. For example, referring to FIG. 2B, an inner region 210a and an outer region 210b are defined in the insulating layer 21. After the insulting layer 21 in the inner region 210a and the outer region 210b is removed, a ring body 22 is formed.

The ring bodies 22 are made of the same material as the insulating layer 21. That is, the ring bodies 22 are made of polyimide (PI), benzocyclobutene (BCB) or polybenzoxazole (PBO).

Further, the ring bodies 22 are positioned outside the edges of the corresponding conductive pads 200, and are over the circuits 201.

Referring to FIG. 2D, a plurality of conductive elements 23, such as solder balls or metal bumps, are formed on and electrically connected to the conductive pads 200 inside the ring bodies 22. Further, the substrate structure 2 can be electrically connected through the conductive elements 23 to another electronic element (not shown), for example, a semiconductor wafer, a chip, an interposer having a plurality of through silicon vias (TSVs) or a circuit board.

In another embodiment, referring to FIG. 2D', if the substrate body 20' is a semiconductor base material, the substrate body 20' has a semiconductor substrate 25 such as a wafer or chip, and at least a contact 250 and an RDL (Redistribution Layer) structure 24 formed on the semiconductor substrate 25. The RDL structure 24 has a plurality of passivation layers 240 and a plurality of redistribution layers 241 formed on the passivation layers 240 and electrically connected to the contact 250, the conductive pads 200 and the circuits 201.

According to the present invention, by forming ring bodies 22, 22' in the openings 210, the conductive elements 23 can be formed inside the ring bodies 22, 22' so as to be prevented from expanding outward during a reflow process, thereby protecting the insulating layer 21 from being compressed by the conductive elements 23 and hence preventing cracking of the insulating layer 21. As such, even if the conductive elements 23 expand to such a great extent that the ring bodies 22, 22' are compressed to crack, it will not cause cracking of the insulating layer 21.

If the semiconductor body 20' is a semiconductor base material, the ring bodies 22, 22' can prevent the conductive elements 23 from expanding outward during a reflow process, thereby preventing cracking of the insulating layer 21 and the RDL structure 24 (or the redistribution layers 241).

Therefore, the insulating layer 21 or the RDL structure 24 can prevent chemicals used in subsequent processes from coming into contact with the substrate body 20, 20' so as to protect the substrate body 20, 20' against contamination. In addition, since moisture cannot enter into the substrate body 20, 20', the invention prevents an oxidization or a short circuit from occurring to the circuits 201 or the redistribution layers 241.

Further, during a reliability test (such as high temperature storage or drop), since the insulating layer 21 has a good structural integrity, there is no unexpected stress variation occurring to the insulating layer 21, thus overcoming the conventional problems such as large-area cracking and poor quality of the insulating layer 21.

Furthermore, even if the openings 210 have a small projective width D, the conductive elements 23 can be prevented by the ring bodies 22, 22' from expanding outward and compressing the insulating layer 21. Therefore, the present invention does not need to increase the projective width D of the openings 210 and hence allows more space on the substrate body 20, 20' to be used for wiring.

Figure 3A:
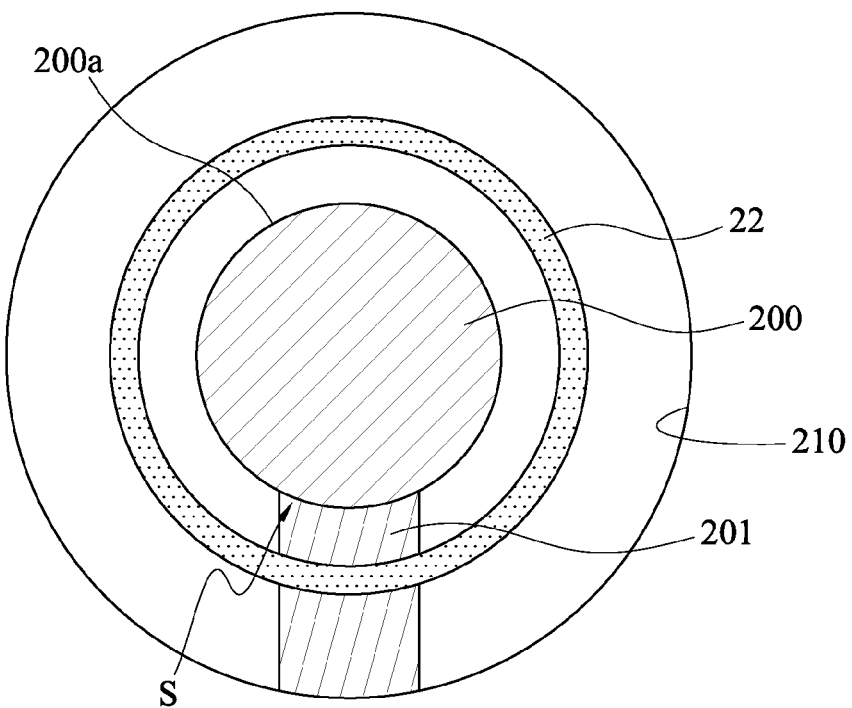
FIGS. 3A to 3C are schematic upper views showing different embodiments of the structure of FIG. 2C.
Figure 3A:
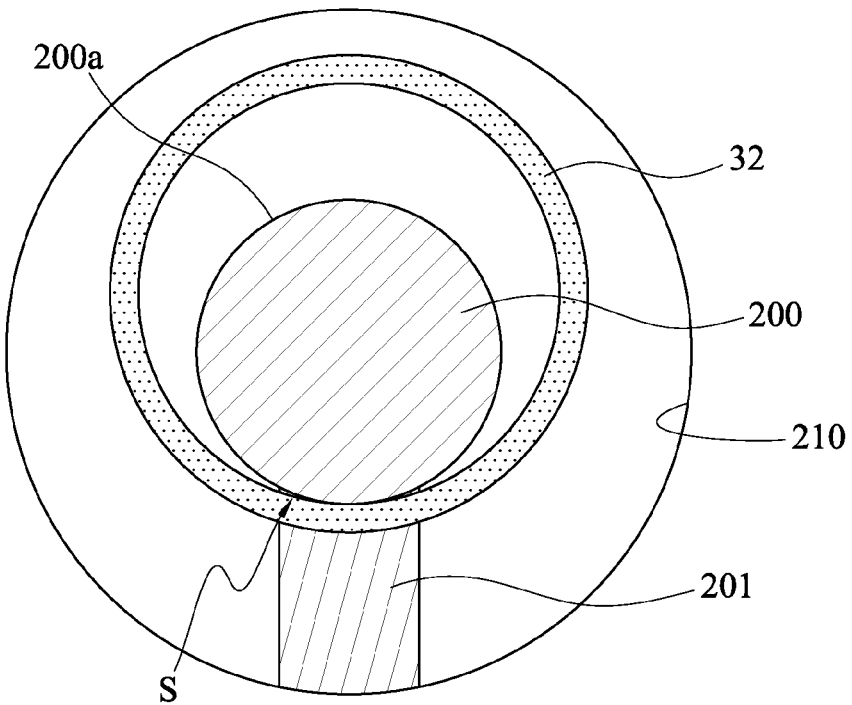
Figure 3B:
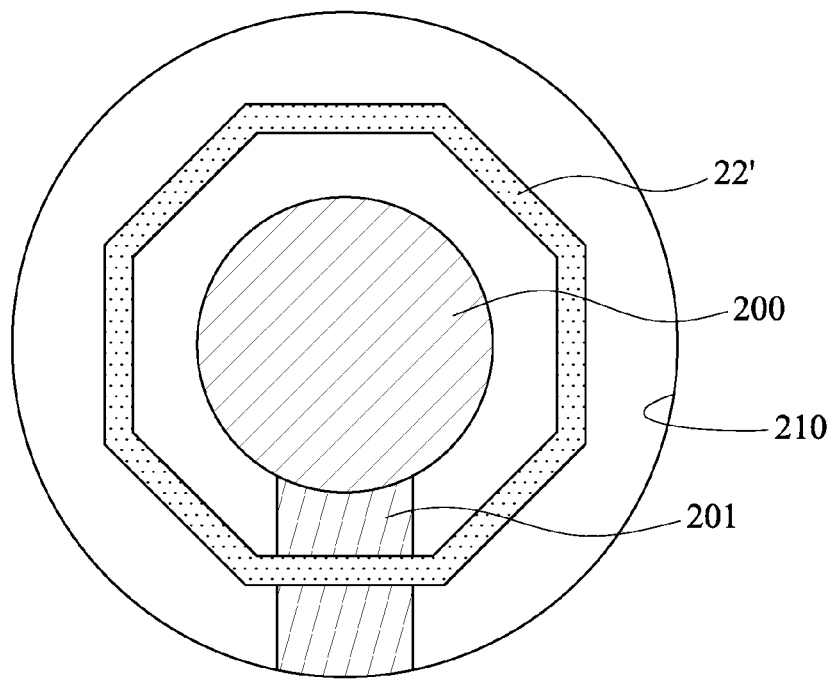

In an embodiment, referring to FIG. 3A', a junction S is formed between the conductive pad 200 and the circuit 201 and the ring body 32 passes through the junction S. Then, the conductive element 23 can be formed to abut against the ring body 32. As such, movement of the conductive element 23 toward the circuit 201 caused by wetting of the conductive element 23 can be prevented by the ring body 32.

Figure 3C:
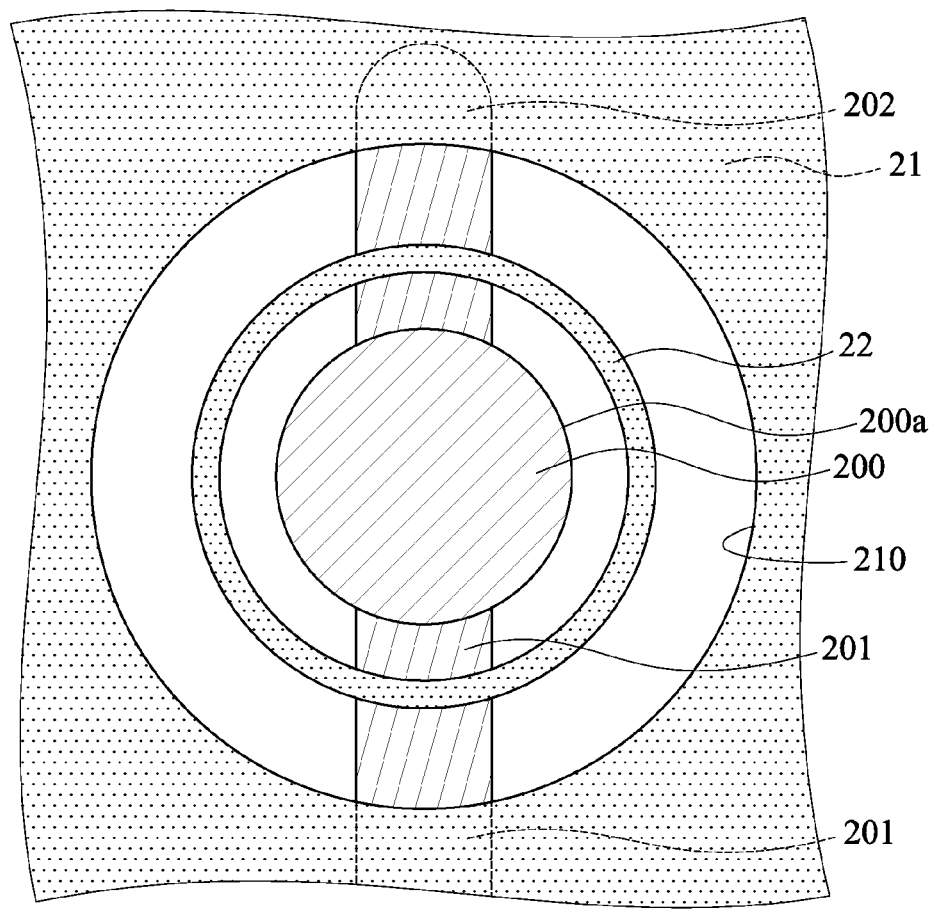

In another embodiment, referring to FIG. 3C, if the projective width D of the opening 210 is large, a metal line 202 can be selectively formed on the substrate body 20 and connected to an edge 200a of the conductive pad 200. The metal line 202 is partially covered by the insulating layer 21 and partially exposed from the opening 210, and the ring body 22 passes through the metal line 202. The metal line 202 and the circuit 201 are pressed and fixed by the insulating layer 21 or the ring body 22 so as to facilitate to fix two sides of the edge 200a of the conductive pad 200 on the substrate body 20, thereby preventing delamination of the conductive pad 200 from the large-sized opening 210.

Further, in other embodiments, the ring bodies 22, 22', 32 and the openings 210 can be separately formed. For example, the openings 210 can be formed first and then the ring bodies 22, 22', 32 can be formed in the openings 210. The ring bodies 22, 22', 32 can be made of a material different from the insulating layer 21.

The present invention further provides a substrate structure 2, which has: a substrate body 20, 20' having a plurality of conductive pads 200; an insulating layer 21 formed on the substrate body 20, 20' and having a plurality of openings 210 for correspondingly exposing the conductive pads 200; and a plurality of ring bodies 22, 22', 32 formed in the openings 210 and corresponding in position to edges 200a of the conductive pads 200.

The substrate body 20, 20' can be a circuit board or a semiconductor base material. A plurality of circuits 201 can be formed on the substrate body 20, 20' and electrically connected to the conductive pads 200. A plurality of junctions S can be formed between the conductive pads 200 and the circuits 201. If the substrate body 20' is a semiconductor base material, the substrate body 20' can further have an RDL structure 24 electrically connected to the conductive pads 200.

The openings 210 can have a projective width D greater than the width W of the conductive pads 200. The insulating layer 21 can be made of polyimide (PI), benzocyclobutene (BCB) or polybenzoxazole (PBO).

The ring bodies 22, 22' can be positioned outside the edges 200a of the corresponding conductive pads 200. The ring bodies 22 can be over the circuits 201. Alternatively, the ring bodies 32 can be over the junctions S. The ring bodies 22, 22', 32 can be of a geometric shape. The ring bodies 22, 22', 32 can be made of the same material as the insulating layer 21. For example, the ring bodies 22, 22', 32 can be made of polyimide (PI), benzocyclobutene (BCB) or polybenzoxazole (PBO).

The substrate structure 2 can further have a plurality of conductive elements 23 formed inside the ring bodies 22, 22', 32 and electrically connected to the conductive pads 200.

According to the present invention, by forming ring bodies in the openings of the insulating layer, the conductive elements can be formed inside the ring bodies so as to be prevented by the ring bodies from expanding outward during a reflow process, thus protecting the insulating layer from being compressed by the conductive elements and hence preventing cracking of the insulating layer.

Since the insulating layer has a good structural integrity, it can prevent chemicals or moisture from entering into the substrate body and hence overcome the conventional problems such as large-area cracking and poor quality of the insulating layer.

Further, since the conductive elements can be prevented by the ring bodies from expanding outward and compressing the insulating layer, the present invention can reduce the projective width of the openings according to the practical need so as to allow more space on the substrate body to be used for wiring.

In addition, if the openings have a large projective width, metal lines and circuits can be connected to the conductive pads and pressed and fixed by the insulating layer (or the ring bodies) so as to facilitate to fix the conductive pads on the substrate body and prevent delamination of the conductive pads.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A substrate structure, comprising:
a substrate body having a plurality of conductive pads;
an insulating layer formed on the substrate body and having a plurality of openings for correspondingly exposing the conductive pads;
a plurality of ring bodies formed in the openings and corresponding in position to edges of the conductive pads, so as to define an inner region and an outer region of the ring bodies, wherein the ring bodies are free from being in direct contact with the insulating layer; and
a plurality of conductive elements formed inside the ring bodies and electrically connected to the conductive pads, wherein the conductive elements are free from being formed in the outer region of the ring bodies.

2. The structure of claim 1, wherein a plurality of circuits are formed on the substrate body and electrically connected to the conductive pads.

3. The structure of claim 2, wherein the ring bodies pass over the circuits.

4. The structure of claim 2, wherein a plurality of junctions are formed between the conductive pads and the circuits and the ring bodies pass over the junctions.

5. The structure of claim 1, wherein the insulating layer is made of a solder mask material or a dielectric material.

6. The structure of claim 1, wherein the ring bodies are positioned outside edges of the corresponding conductive pads.

7. The structure of claim 1, wherein the ring bodies and the insulating layer are made of a same material.

8. The structure of claim 1, wherein the ring bodies are made of polyimide (PI), benzocyclobutene (BCB) or polybenzoxazole (PBO).

9. The structure of claim 1, wherein the substrate body is a circuit board or a semiconductor base material.

10. The structure of claim 9, wherein if the substrate body is a semiconductor base material, the semiconductor body further has an RDL (Redistribution Layer) structure electrically connected to the conductive pads.

11. A method for fabricating a substrate structure, comprising the steps of:

providing a substrate body having a plurality of conductive pads;
forming an insulating layer on the substrate body;
forming a plurality of openings in the insulating layer for correspondingly exposing the conductive pads and forming in the openings a plurality of ring bodies corresponding in position to edges of the conductive pads, so as to define an inner region and an outer region of the ring bodies, wherein the ring bodies are free from being in direct contact with the insulating layer; and
forming inside the ring bodies a plurality of conductive elements electrically connected to the conductive pads, wherein the conductive elements are free from being formed in the outer region of the ring bodies.

12. The method of claim 11, wherein the substrate body further has a plurality of circuits formed thereon and electrically connected to the conductive pads.

13. The method of claim 12, wherein the ring bodies pass over the circuits.

14. The method of claim 12, wherein a plurality of junctions are formed between the conductive pads and the circuits and the ring bodies pass over the junctions.

15. The method of claim 11, wherein the insulating layer is made of a solder mask material or a dielectric material.

16. The method of claim 11, wherein the ring bodies are positioned outside edges of the corresponding conductive pads.

17. The method of claim 11, wherein the ring bodies and the insulating layer are made of a same material.

18. The method of claim 11, wherein the ring bodies are made of polyimide (PI), benzocyclobutene (BCB) or polybenzoxazole (PBO).

19. The method of claim 11, wherein the substrate body is a circuit board or a semiconductor base material.

20. The method of claim 19, wherein if the substrate body is a semiconductor base material, the semiconductor body further has an RDL (Redistribution Layer) structure electrically connected to the conductive pads.

21. The method of claim 11, wherein the ring bodies and the openings are formed at the same time.

22. The method of claim 21, wherein the insulating layer is partially removed to form the openings and portions of the insulating layer inside the openings are retained to form the ring bodies.

* * * * *